(12) United States Patent
Lee et al.

(10) Patent No.: US 7,858,435 B2
(45) Date of Patent: Dec. 28, 2010

(54) ORGANIC ELECTRO-LUMINANCE DEVICE AND METHOD FOR FABRICATING THE SAME

(75) Inventors: Ho Nyun Lee, Seoul (KR); Chang Nam Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/364,702

(22) Filed: Feb. 3, 2009

(65) Prior Publication Data

US 2009/0142868 A1 Jun. 4, 2009

Related U.S. Application Data

(62) Division of application No. 11/005,018, filed on Dec. 7, 2004, now Pat. No. 7,605,393.

(30) Foreign Application Priority Data

Dec. 8, 2003 (KR) ............... 10-2003-0088603

(51) Int. Cl.
*H01L 51/40* (2006.01)
(52) U.S. Cl. ............... 438/99; 438/22; 438/29; 438/48; 257/E51.001
(58) Field of Classification Search .......... 257/40; 438/22, 29, 48, 99
See application file for complete search history.

(56) References Cited

U.S. PATENT DOCUMENTS

| 6,571,728 | B1 | 6/2003 | Abiko | |
|---|---|---|---|---|
| 6,995,035 | B2 | 2/2006 | Cok et al. | |
| 7,116,308 | B1 * | 10/2006 | Heeks et al. | 345/102 |
| 7,250,930 | B2 * | 7/2007 | Hoffman et al. | 345/87 |
| 2003/0168968 | A1 | 9/2003 | Sotani et al. | |
| 2003/0190768 | A1 | 10/2003 | Lu et al. | |
| 2003/0219530 | A1 | 11/2003 | Yamazaki et al. | |
| 2004/0090187 | A1 * | 5/2004 | Wu et al. | 315/169.3 |

FOREIGN PATENT DOCUMENTS

| EP | 1 128 439 | 8/2001 |
|---|---|---|
| JP | 2000-243558 | 9/2000 |
| JP | 2001-109395 | 4/2001 |
| JP | 2003-142258 | 5/2003 |
| KR | 10-2003-0022471 | 3/2003 |
| WO | WO 03/007664 | 1/2003 |
| WO | WO 03/041453 | 5/2003 |

OTHER PUBLICATIONS

Office Action issued by the Korean Intellectual Property Office on Oct. 24, 2005.
European Search Report dated Jun. 13, 2006.
Japanese Office Action dated Nov. 8, 2006.
European Search Report dated Apr. 7, 2010.

* cited by examiner

*Primary Examiner*—Wai-Sing Louie
(74) *Attorney, Agent, or Firm*—KED & Associates LLP (57) ABSTRACT

Provided is an organic EL device and fabrication method thereof that can prevent the performance of the organic EL layer and the TFT from being lowered in forming the cathode using an E-beam heating evaporation process. The organic EL device includes a substrate, an anode, an organic EL layer, a cathode, and a transparent electrode connected with the cathode to extract the cathode to an outside, and further includes an interconnection line connected to the transparent electrode, for discharging charges accumulated on the cathode outside the organic EL device. According to the present invention, since the charges generated on the cathode can be removed through the interconnection line, the underlying organic EL layer and the TFT can be prevented from being damaged, so that the device reliability can be enhanced.

7 Claims, 6 Drawing Sheets

ORGANIC ELECTRO-LUMINANCE DEVICE AND METHOD FOR FABRICATING THE SAME

This application is a Divisional of U.S. patent application Ser. No. 11/005,018, filed Dec. 7, 2004 now U.S. Pat. No. 7,605,393, which claims the benefit under 35 U.S.C. §119 of Korean Application No. 10-2003-0088603 filed on Dec. 8, 2003 in Korea. The entire disclosure of the prior application is considered as being part of the disclosure of the accompanying application and is hereby incorporated by reference therein.

BACKGROUND OF THE INVENTION

1. Field of the Invention

The present invention relates to a flat panel display, and more particularly, to an organic EL device and a method for fabricating the same.

2. Discussion of the Related Art

In recent years, as the size of the display devices increases, demand on a flat panel display occupying a small space increases. As one of the flat panel displays, an organic electro-luminance (EL) device called an organic light emitting diode (OLED) is being developed in a rapid speed, and various prototypes have been published.

The organic EL device is a device to emit light while an electron and a hole are injected into an organic emission layer disposed between a first electrode, electron injection electrode (cathode) and a second electrode, hole injection electrode (anode), the electron and the hole are bonded to form a pair of electron and hole and generate an exciton, and the generated exciton disappears from an excited state to a base state.

Such an organic EL device is being actively researched due to a relatively low operation voltage of 5-10 V compared with a plasma display panel (PDP) or an inorganic EL display.

Also, since the organic EL device has superior features such as a wide viewing angle, a high speed response and a high contrast, it can be used as a pixel of a graphic display, a television image display or a pixel of a surface light source. Further, since the organic EL device can be formed on a flexible transparent substrate and has slim, lightweight and good color sense characteristics, it is suitable for a next generation flat panel display (FDP).

Furthermore, since the organic EL device does not need a backlight compared with the LCD well known, it has advantages such as a low power consumption and a superior color sense.

In general, the organic EL devices can be classified into a passive type and an active type.

First, a passive type organic EL device will be described.

Figure 1A:
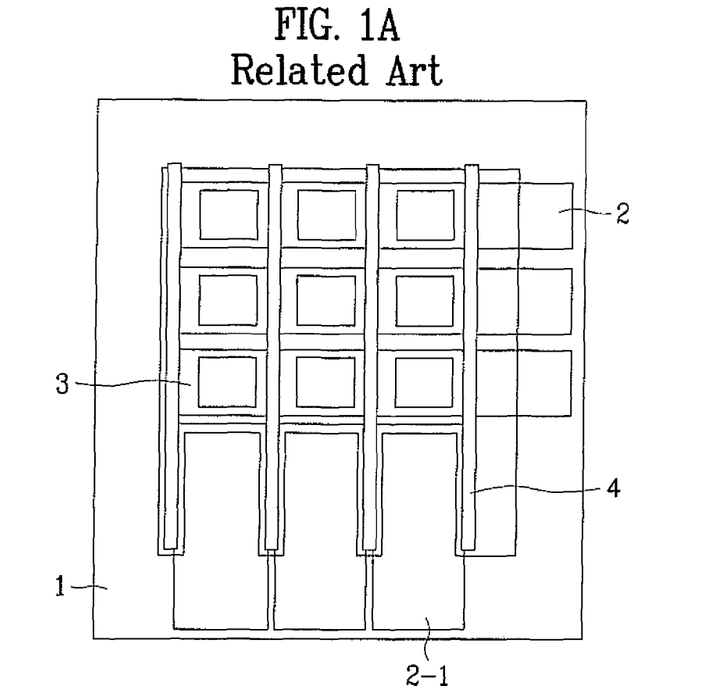
FIGS. 1A and 1B are plane views illustrating a process of fabricating a passive type organic EL device according to the related art.
Figure 1B:
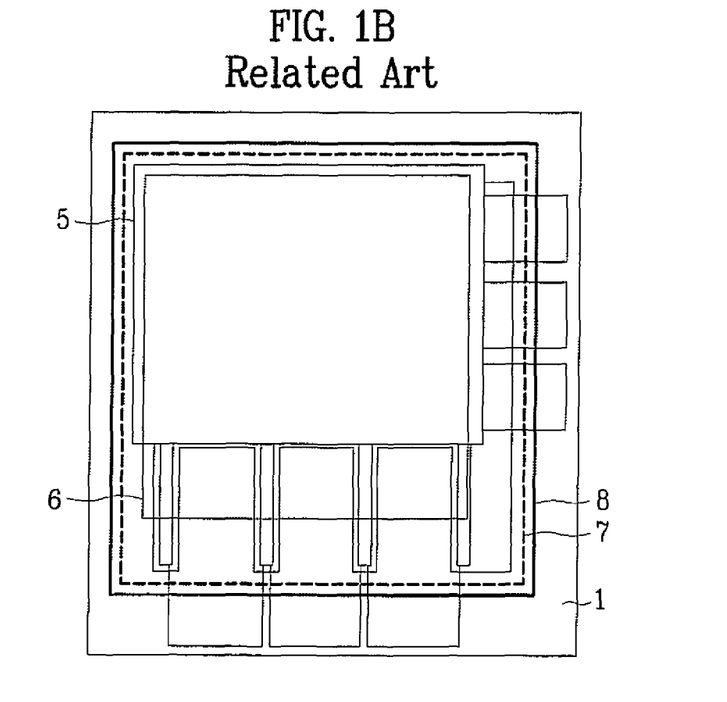

FIGS. 1A and 1B are plane views illustrating a process of fabricating a passive type organic EL device according to the related art.

In the process of fabricating a passive type organic EL device, an indium tin oxide (ITO) strip 2 serving as anode is formed on a glass substrate 1 as shown in FIG. 1.

At this time, a short ITO strip 2-1 is formed at a portion where one end of cathode is being formed, simultaneously with the formation of the ITO strip 2. Forming the short ITO strip 2-1 in advance is to make it easy to form a metal extension line to be connected with cathode.

If necessary, an auxiliary electrode is formed on the ITO strips 2 and 2-1, and then an insulating layer 3 is formed on the auxiliary electrode. Next, for insulation between cathodes, an electrical insulation separator 4 is formed.

Next, as shown in FIG. 1B, an organic EL layer 5 including a hole transporting layer, an emission layer and an electron transporting layer is coated and then a cathode 6 is formed of a conductive material such as an Mg—Ag alloy, aluminum (Al).

At this time, the cathode 6 can contact the short ITO strip 2-1 by not forming the organic EL layer 5 on the short ITO strip 2-1 but forming the cathode 6 on the short ITO strip 2-1.

Lastly, a seal plate 8 is attached on a resultant structure by a sealant 7, thereby completing the passive type organic EL device.

Next, an active type organic EL device will be described with reference to the accompanying drawings.

Figure 2A:
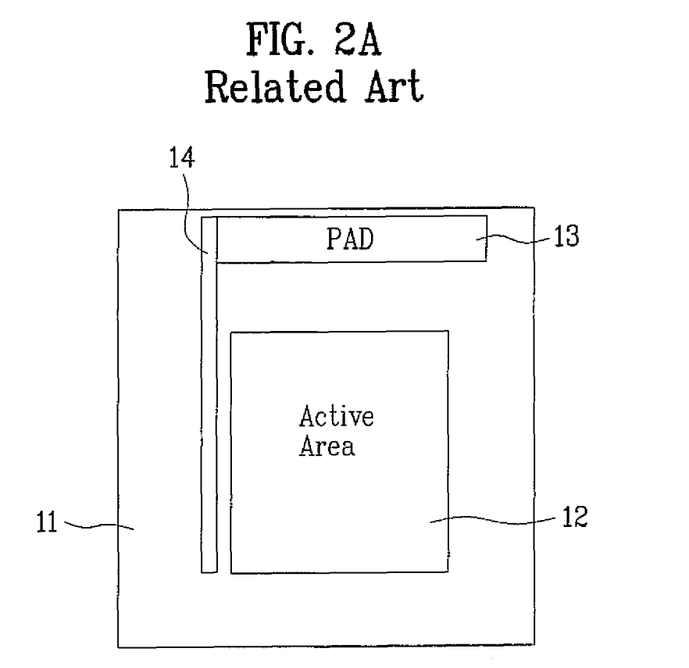
FIGS. 2A and 2B are plane views illustrating a process of fabricating an active type organic EL device according to the related art.
Figure 2B:
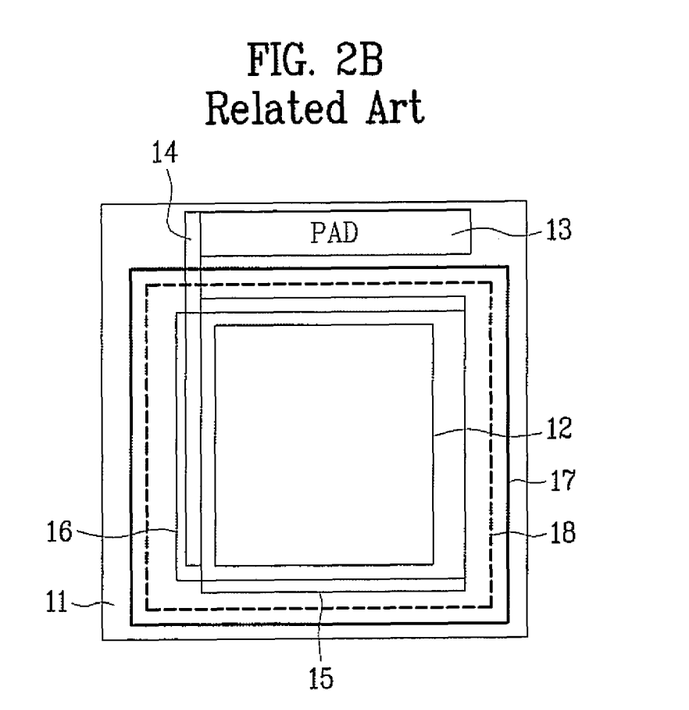

FIGS. 2A and 2B are plane views illustrating a process of fabricating an active type organic EL device according to the related art.

First, as shown in FIG. 2A, an active area 12 and a pad 13 are formed on a glass substrate 11.

Thereafter, a metal line 14 electrically connected with the pad is formed at a portion where one end of a cathode is positioned so as to make it easy to connect the metal line 14 with the cathode.

Although not shown in the drawings, the active area 12 includes a plurality of unit cells arranged in a matrix configuration, each unit cell including a drive transistor (TFT) and an anode connected to drain electrode of the drive TFT.

Continuously, as shown in FIG. 2B, an organic EL layer 15 is formed on the active area 12.

At this time, the organic EL layer 15 should not be formed on the metal line 14 so that the metal line 14 may contact the cathode to be formed later.

Next, a cathode 16 is formed on the organic EL layer 15. At this time, the cathode 16 is formed extending to an upper surface of the metal line 14 such that the cathode 16 can contact the metal line 14.

Next, a passivation layer (not shown) including an oxygen adsorbent layer, a moisture absorbent layer and a moisture permeation preventing layer is formed on a resultant structure and then a seal plate 18 is attached on the passivation layer using a sealant 17, thereby completing the active type organic EL display panel.

The above organic EL device is required to form first the organic EL layer and secondly the cathode metal film in a vacuum state regardless of whether the organic EL device is the passive type or the active type.

The metal thin film can be formed by one of three deposition methods consisting of a vacuum evaporation, a sputtering and an ion-plating.

Among the three methods, the vacuum evaporation is the most widely used to form the cathode.

Also, the vacuum evaporation can be further classified into four types consisting of a resistance heating evaporation, an E-beam heating evaporation, a RF heating evaporation, and a laser beam heating evaporation.

Among the four evaporation methods, the resistance heating evaporation is the most widely used to form the cathode.

Figure 3:
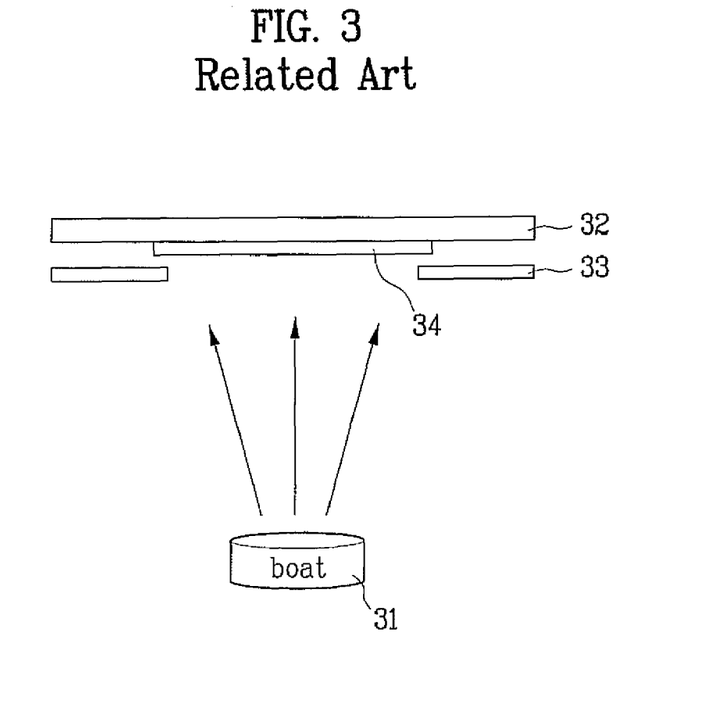
FIG. 3 is a schematic view illustrating a resistance heating evaporation process.

FIG. 3 is a schematic view illustrating a resistance heating evaporation process.

In order to form the cathode of a thin metal film using the resistance heating evaporation, a target material to be evaporated, for example, a boat 31 filled with aluminum (Al) is disposed at a lower side of a chamber.

Next, a substrate 32 is positioned at a sample holder disposed at an upper side of the chamber, and then a mask 33 is aligned below the substrate 32 such that a thin film having a desired pattern corresponding to a pattern of the mask 33 is formed on the substrate 32.

Next, the chamber is made in a vacuum state and the boat 31 is heated by applying a current thereto, so that the Al received in the boat 31 is evaporated.

The evaporated Al molecules are deposited on the substrate 32 to form a cathode 34.

However, the above resistance heating evaporation process has disadvantages such as many preheating time and frequent exchange of the boat due to limitation in capacity of the boat receiving the target material.

Also, it is required to release the vacuum state of the chamber whenever the boat is exchanged. To make the exchanged boat be in a vacuum state, 2-3 hours are wasted, which is unsuitable for mass production.

Accordingly, the E-beam heating evaporation process having a faster preheating time than in the resistance heating evaporation process and using a crucible instead of the boat is presently employed in the mass production.

Figure 4:
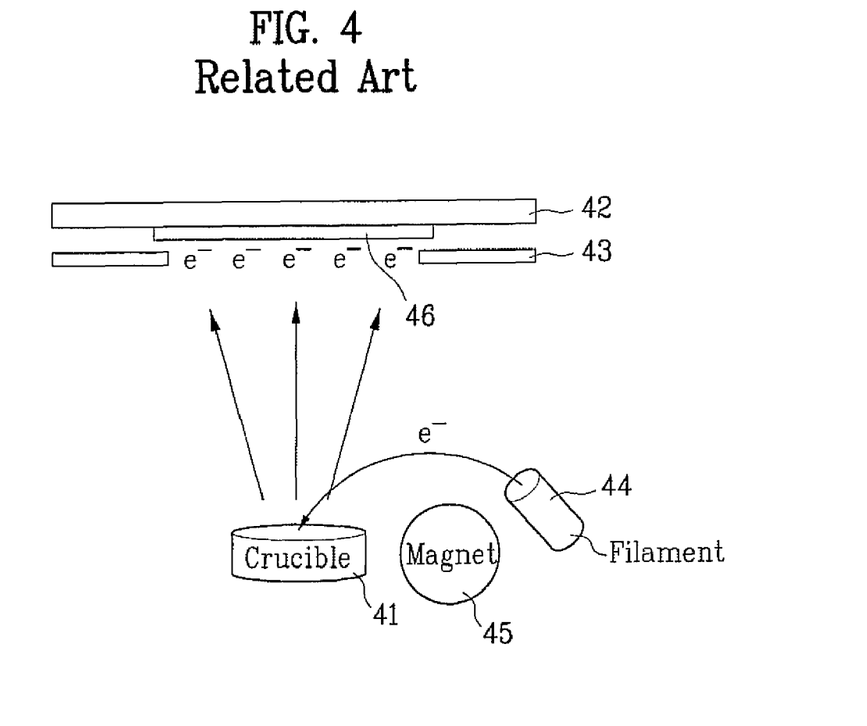
FIG. 4 is a schematic view illustrating an E-beam heating evaporation process.

FIG. 4 is a schematic view illustrating an E-beam heating evaporation process.

To form a cathode of a thin metal film using the E-beam heating evaporation process, a target material to be evaporated, for example, a crucible 41 filled with aluminum (Al) is loaded at a lower side of a chamber.

Next, a substrate 42 is positioned at a sample holder disposed at an upper side of the chamber, and then a mask 43 is aligned below the substrate 42 such that a thin film having a desired pattern corresponding to a pattern of the mask 43 is formed on the substrate 42.

In addition, a filament 44 emitting electrons is positioned at a side portion of the crucible 41, and a magnet 45 is also positioned around the crucible 41 so as to provide a magnetic force for transferring the electrons emitted from the filament 44 to the crucible 41.

Thereafter, as the filament 44 is heated, electrons are emitted therefrom. The emitted electrons are curved in the form of a circle by the magnetic force of the magnet 45 and collide with a center of the Al target material.

Accordingly, the Al target material is heated up to an evaporation temperature due to the electrons having a high energy and is evaporated. The evaporated Al molecules are deposited on the substrate 42 to form the cathode 46.

However, forming the cathode 46 using the related art E-beam heating evaporation has the following problem.

Charges are accumulated on the cathode by the electrons emitted from the filament 44, so that the performance of the organic EL layer and the TFT is lowered, resulting in a low reliability.

SUMMARY OF THE INVENTION

Accordingly, the present invention is directed to an organic EL device and a driving apparatus thereof that substantially obviate one or more problems due to limitations and disadvantages of the related art.

An object of the present invention is to provide an organic EL device and fabrication method thereof that can prevent the performance of the organic EL layer and the TFT from being lowered in forming the cathode using an E-beam heating evaporation process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic EL device comprising a substrate, an anode, an organic EL layer, a cathode, a transparent electrode connected with the cathode to extract the cathode to an outside, and an interconnection line connected to the transparent electrode, for discharging charges accumulated on the cathode outside the organic EL device.

In another aspect of the present invention, there is provided a method for fabricating an organic EL device comprising a substrate, an anode, an organic EL layer, a cathode, and a transparent electrode connected with the cathode to extract the cathode to an outside, the method comprising: forming an interconnection line connected to the transparent electrode, for discharging charges accumulated on the cathode outside the organic EL device. It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

First, a passive type organic EL device according to the present invention will be described.

Figure 5A:
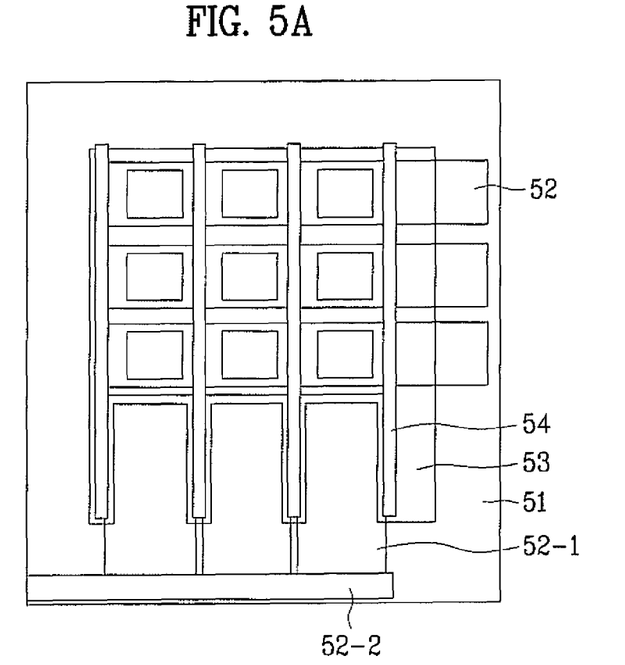
FIGS. 5A and 5B are plane views illustrating a process of fabricating a passive type organic EL device according to the present invention.
Figure 5B:
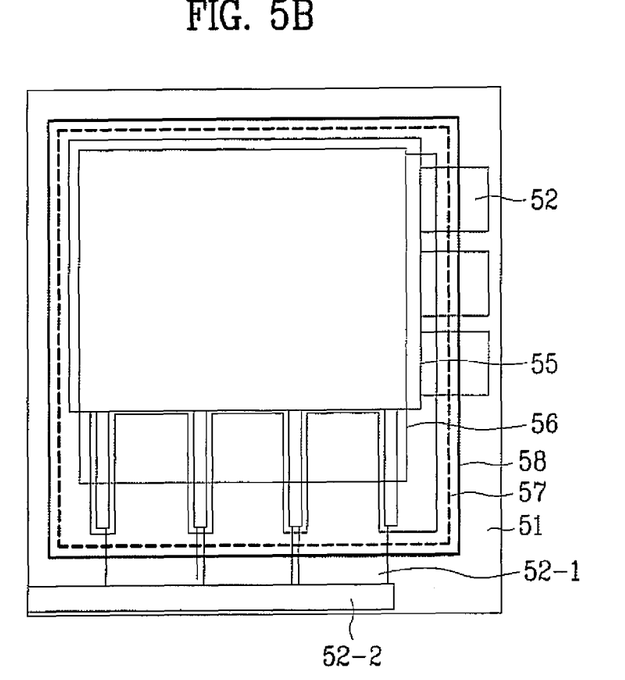

FIGS. 5A and 5B are plane views illustrating a process of fabricating a passive type organic EL device according to the present invention.

First, as shown in FIG. 5A, an ITO strip 52 serving as anode is formed on a glass substrate 51.

At this time, a short ITO strip 52-1 is formed at apportion where one end of cathode is being formed, simultaneously with formation of the ITO strips 52. Forming the short ITO strip 52-1 in advance is make it easy ro form a metal extension line to be connected with cathode.

Next, an interconnection line 52-2 is formed together with the ITO strips 52-1. The interconnection line 52-2 is to short 52-1 and thus emit charges accumulated on the cathode while the cathode is formed, outside the glass substrate 51.

At this time, it is noted that forming the interconnection line 52-2 together with the ITO strip 52-1 corresponds to only a preferred embodiment of the present invention. Since the position of the interconnection line 52-2 is outside the effective display area of the organic EL device, another hole is not formed thereon. Accordingly, the interconnection line 52-2 can be formed whenever in the whole fabrication process.

Of course, it is possible to form the interconnection line after the formation of the cathode such that the accumulated charges are emitted to an outside.

However, it is preferable that the interconnection line 52-2 is formed before the formation of the cathode such that the charges accumulated on the cathode due to the E-beam evaporation are rapidly discharged to an outside.

The interconnection line 52-2 is made of at least one conductive material selected from the group consisting of Cr, Cu, Mo, W, Au, Ni, Ag, Ti, Ta, Al and AiNd.

If necessary, an auxiliary electrode is formed on the ITO strips 52 and 52-1, and then an insulating layer 53 is formed on the auxiliary electrode. Next, for insulation between cathodes, an electrical insulation separator 54 is formed.

Next, as shown in FIG. 5B, an organic EL layer 55 including a hole transporting layer, an emission layer and an electron transporting layer is coated. At this time, for a contact between the cathode to be formed later and the ITO strip 52-1, the organic EL layer 55 is not formed on the ITO strip 52-1.

Next, a cathode 56 is formed of a conductive material such as an Mg—Ag alloy, aluminum (Al) by the E-beam evaporation process.

At this time, the cathode 56 can contact the short ITO strip 52-1 by forming the cathode 6 on the short ITO strip 52-1.

While the E-beam evaporation is performed, charges are accumulated on the cathode 56. These accumulated charges are discharged outside the glass substrate 51 via the ITO strip 52-1 contacting the cathode 56 and the interconnection line 52-2.

Lastly, a seal plate 58 is attached on a resultant structure by a sealant 57, thereby completing the passive type organic EL device.

Next, an active type organic EL device according to the present invention will be described with reference to the accompanying drawings.

Figure 6A:
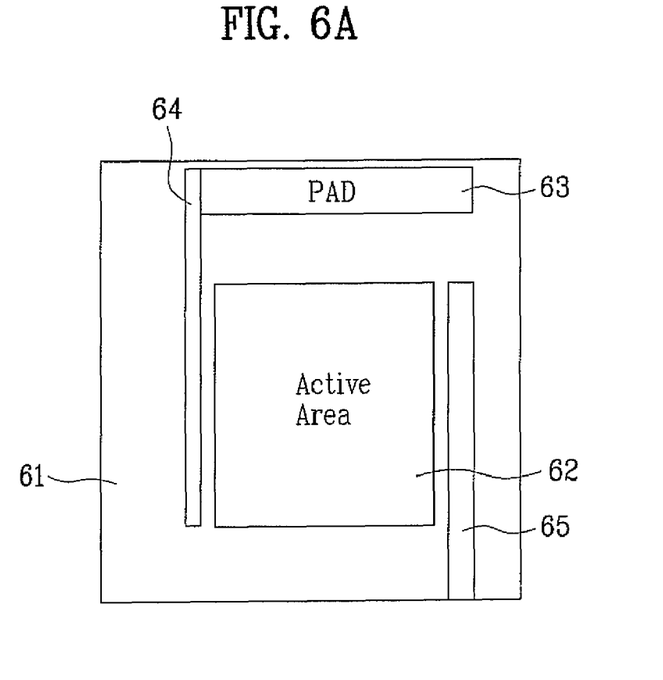
FIGS. 6A and 6B are plane views illustrating a process of fabricating an active type organic EL device according to the present invention.
Figure 6B:
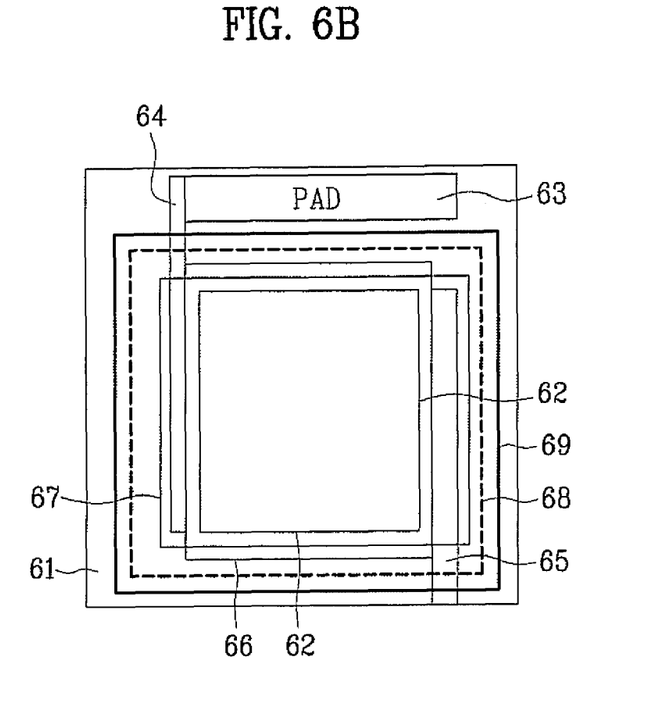

FIGS. 6A and 6B are plane views illustrating a process of fabricating an active type organic EL device according to the present invention.

First, as shown in FIG. 6A, an active area 62 and a pad 63 are formed on a glass substrate 61.

Thereafter, a first interconnection line 64 electrically connected with the pad 63 is formed at a portion where one end of a cathode is positioned so as to make it easy to connect the first interconnection line 64 with the cathode.

A second interconnection line 65 is formed at a portion where the other end of the cathode is positioned. The second interconnection line 65 is to extract charges accumulated during the formation of the cathode to an outside of the glass substrate 61.

Although not shown in the drawings, the active area 62 includes a plurality of unit cells arranged in a matrix configuration, each unit cell including a drive transistor (TFT) and an anode connected to drain electrode of the drive TFT. Hereinafter, a method for forming the active area 62 will be described.

An island-shaped semiconductor layer is formed on the glass substrate 61 and then a gate insulating layer is formed on an entire surface of a resultant glass substrate including the semiconductor layer.

Next, a gate electrode is formed at a portion overlapping a central portion of the semiconductor layer on the gate insulating layer.

Next, p-type or n-type impurities are implanted into the semiconductor layer using the gate electrode as a mask.

To activate the implanted impurities, an annealing is performed to form source region and drain region, thereby completing the drive TFT.

Next, a contact contacting the source electrode and the drain electrode of the drive TFT is formed penetrating the insulating layer and the gate insulating layer, and then an insulating layer is again formed on an entire surface of a resultant substrate.

Next, the planarization insulating layer and the insulating layer are selectively removed to form a via-hole for exposing a surface of the contact connected with the drain electrode.

Next, a material for the formation of anode is deposited on the planarization insulating layer including the via-hole such that the via-hole is filled with the material.

The material deposited for the formation of anode is selectively removed to form anode such that the anode is separated in a pixel unit. Thereafter, an insulating layer is formed on an entire surface except for the emission area to form the active area 62.

As aforementioned, the second interconnection line 65 is formed concurrently with the formation of the first interconnection line 64, which only corresponds to an embodiment of the present invention. In other words, the second interconnection line 65 may be formed concurrent with the formation of anode of the active area 62, with the formation of the semiconductor layer used as the source and drain electrodes, or with the formation of the gate electrode.

In addition, the second interconnection line 62 may be formed of a conductive material selected from the group consisting of Cr, Cu, Mo, W, Au, Ni, Ag, Ti, Ta, Al and AlNd.

Continuously, as shown in FIG. 6B, an organic EL layer 66 is formed on the active area 62.

At this time, the organic EL layer 66 should not be formed on the first and second interconnection lines 64 and 65 so that the first and second interconnection lines 64 and 65 may contact the cathode to be formed later.

Next, a cathode 67 is formed on the organic EL layer 66 by an E-beam evaporation process. At this time, the cathode 67 is formed extending to an upper surface of the first and second interconnection lines 64 and 65 such that the cathode 67 can contact the first and second interconnection lines 64 and 65.

While the E-beam evaporation is performed, charges are accumulated on the cathode 67. These accumulated charges are discharged outside the glass substrate 61 through the second interconnection line 65 contacting the cathode 67.

Next, a passivation layer (not shown) including an oxygen absorbent layer, a moisture absorbent layer and a moisture permeation preventing layer is formed on a resultant structure and then a seal plate 69 is attached on the passivation layer using a sealant 68, thereby completing the active type organic EL display panel.

Figure 7:
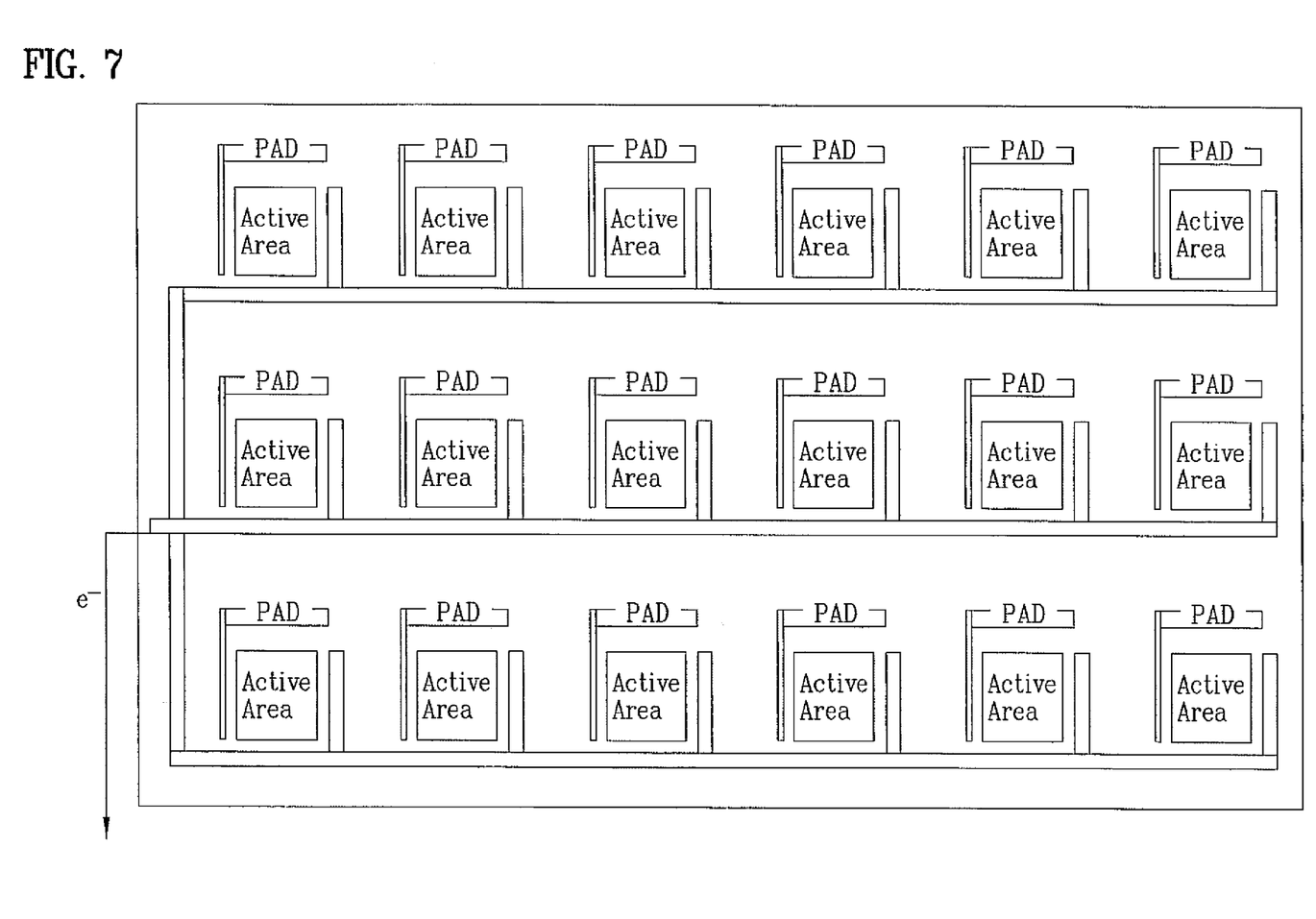
FIG. 7 is a plane view illustrating an array of at least two organic EL devices on a large-sized substrate according to the present invention.

FIG. 7 is a plane view illustrating an array of at least two organic EL devices on a large-sized substrate used in a mass production according to the present invention.

In other words, FIG. 7 shows that the interconnection lines 64 and 65 for extracting charges from each organic EL device are all connected with the respective organic EL devices and extend to an end point of the glass substrate so as to make easy a contact at an outside.

As described above, in the organic EL device and fabrication method thereof according to the present invention, it is possible to extract charges accumulated on a cathode while an E-beam evaporation is performed for the formation of the cathode, outside the glass substrate. Accordingly, the underlying organic EL layer and the TFT can be prevented from being damaged due to the charges accumulated on the cathode, so that the reliability of the organic EL device can be enhanced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating an organic EL device, the method comprising:

forming an anode, a transparent electrode, and an interconnection line coupled to the transparent electrode on a substrate;

forming an organic EL layer on the anode; and forming a cathode on the organic EL layer, the cathode being connected with the transparent electrode to extract the cathode to an outside, wherein the interconnection line discharges charges accumulated on the cathode outside the organic EL device.

2. The method of claim 1, wherein the forming the interconnection line is performed before forming the anode.

3. A method for fabricating an organic EL device having an active area including a plurality of unit pixels, the method comprising:

forming an anode, a pad, a first interconnection line coupled to the pad, and a second interconnection line on a substrate;

forming an organic EL layer on the anode; and forming a cathode on the organic EL layer, the cathode being connected with the first and second interconnection lines to extract the cathode to an outside at a predetermined portion around the active area, wherein the second interconnection line discharges charges accumulated on the cathode outside the organic EL device.

4. The method of claim 3, wherein the forming the second interconnection line is performed concurrently with the formation of the first interconnection line.

5. The method of claim 3, wherein the forming the second interconnection line is performed concurrently with the formation of the anode.

6. The method of claim 3, wherein the forming the second interconnection line is performed concurrently with the formation of a source/drain electrode of a TFT of the plurality of unit pixels.

7. The method of claim 3, wherein the forming the second interconnection line is performed concurrently with the formation of a gate of a TFT of the plurality of unit pixels.

* * * * *